(12) United States Patent
Sebastian et al.

(10) Patent No.: US 11,873,607 B2
(45) Date of Patent: Jan. 16, 2024

(54) MOISTURE BARRIERS FOR PAPER MATERIALS

(71) Applicant: R.J. REYNOLDS TOBACCO PRODUCTS, Winston-Salem, NC (US)

(72) Inventors: Andries Don Sebastian, Clemmons, NC (US); Pankaj Patel, Clemmons, NC (US); Bruce Bengtsson, Winston Salem, NC (US); Stephanie A. Whittington, Kernersville, NC (US); Erkki Mikael Salo, Espoo (FI); Tero Tapani Malm, Tampere (FI)

(73) Assignee: R.J. Reynolds Tobacco Company, Winston-Salem, NC (US)

( * ) Notice: Subject to any disclaimer, the term of this patent is extended or adjusted under 35 U.S.C. 154(b) by 1000 days.

(21) Appl. No.: 16/543,224

(22) Filed: Aug. 16, 2019

(65) Prior Publication Data

US 2019/0380385 A1 Dec. 19, 2019

Related U.S. Application Data

(62) Division of application No. 14/543,568, filed on Nov. 17, 2014, now Pat. No. 10,420,370.

(51) Int. Cl.
*D21H 21/16* (2006.01)
*D21H 27/10* (2006.01)
(Continued)

(52) U.S. Cl.
CPC ....... *D21H 21/16* (2013.01); *C23C 16/45555* (2013.01); *D21H 19/82* (2013.01); *D21H 27/10* (2013.01)

(58) Field of Classification Search
CPC ......... B32B 2311/18; B32B 5/02; B32B 7/12; B32B 15/14; B32B 17/10788;
(Continued)

(56) References Cited

U.S. PATENT DOCUMENTS 4,717,017 A 1/1988 Sprinkel et al.
4,836,378 A 6/1989 Lephardt
(Continued)

FOREIGN PATENT DOCUMENTS

EP 2 769 930 A1 8/2014
IN 1441/MUM/2011 6/2012
(Continued)

OTHER PUBLICATIONS

The International Search Report and Written Opinion of the International Searching Authority issued in PCT/US2015/059689, dated Feb. 2, 2016, 7 pages.

*Primary Examiner* — Scott R. Walshon
(74) *Attorney, Agent, or Firm* — Womble Bond Dickinson (US) LLP

(57) ABSTRACT

Provided herein is a tobacco packaging material, comprising a paper material coated with at least one polymer layer. The polymer layer comprises at least one repulpable polymer, and wherein the tobacco packaging material has a water vapor transmission rate (WVTR) that is at least 90% lower than the paper material. Further provided is a tobacco package comprising the tobacco packaging material, wherein the tobacco package is substantially free of any foil inner liner or polypropylene film. Further described is a method for making the tobacco packaging material, comprising extrusion coating at least one repulpable polymer onto a paper material to form a polymer layer, and optionally further depositing at least one atomic layer deposition (ALD) layer that comprises a metal oxide.

7 Claims, 16 Drawing Sheets

(51) Int. Cl.
*D21H 19/82* (2006.01)
*C23C 16/455* (2006.01)

(58) Field of Classification Search
CPC ........ B32B 17/10889; B32B 2260/021; B32B 2260/046; B32B 2307/202; B32B 2307/732; B32B 2307/748; B32B 27/30; B32B 5/12; B32B 7/06; B32B 9/007; B32B 9/043; B32B 15/00; B32B 17/10541; B32B 17/10559; B32B 17/10568; B32B 17/10761; B32B 18/00; B32B 2255/10; B32B 2255/12; B32B 2255/20; B32B 2255/26; B32B 2307/302; B32B 2371/00; B32B 2379/08; B32B 2457/14; B32B 27/02; B32B 27/08; B32B 27/10; B32B 27/281; B32B 27/285; B32B 27/308; B32B 27/365; B32B 27/38; B32B 33/00; B32B 37/025; B32B 37/14; C23C 16/50; C23C 14/086; C23C 14/3414; C23C 16/401; C23C 16/045; C23C 16/505; C23C 16/52; C23C 16/54; C23C 16/458; C23C 14/08; C23C 14/34; C23C 16/45525; C23C 14/54; C23C 14/566; C23C 16/345; C23C 16/45529; C23C 28/00; C23C 14/06; C23C 14/0658; C23C 14/0676; C23C 14/28; C23C 14/3407; C23C 14/3457; C23C 14/3464; C23C 14/352; C23C 14/564; C23C 14/5806; C23C 16/30; C23C 16/308; C23C 16/403; C23C 16/407; C23C 16/44; C23C 16/45553; C23C 16/45555; C23C 28/04; C23C 28/42; C23C 30/00; A24F 15/00; A24F 15/02; A24F 15/12; D21H 19/00; D21H 19/36; D21H 19/38; D21H 19/385; D21H 19/42; D21H 19/72; D21H 19/82; D21H 21/00; D21H 21/16; D21H 21/28; D21H 21/285; D21H 27/10
See application file for complete search history.

(56) References Cited

U.S. PATENT DOCUMENTS

| | | | |
|---|---|---|---|
| 4,852,734 | A | 8/1989 | Allen et al. |
| 5,139,140 | A | 8/1992 | Burrows et al. |
| 5,192,262 | A | 3/1993 | Amendola et al. |
| 5,333,729 | A | 8/1994 | Wolfe |
| 5,542,529 | A | 8/1996 | Hein et al. |
| 5,595,803 | A | 1/1997 | May et al. |
| 6,576,294 | B1 | 6/2003 | Phillips et al. |
| 6,585,823 | B1 * | 7/2003 | Van Wijck .......... C23C 16/4412 118/725 |
| 7,118,792 | B2 | 10/2006 | Hewitt et al. |
| 7,927,942 | B2 * | 4/2011 | Raaijmakers .......... C23C 16/56 438/755 |
| 8,118,161 | B2 | 2/2012 | Guerrera et al. |
| 8,522,515 | B2 | 9/2013 | Carter et al. |
| 8,783,454 | B2 | 7/2014 | Igo |
| 2004/0194691 | A1 * | 10/2004 | George ................... C23C 16/14 117/84 |
| 2011/0223401 | A1 * | 9/2011 | Harlin ............... C23C 16/45555 427/250 |
| 2014/0099502 | A1 * | 4/2014 | Nevalainen ............. B65D 3/22 524/502 |
| 2014/0272163 | A1 * | 9/2014 | Tilton ...................... D21J 1/08 427/427.4 |

FOREIGN PATENT DOCUMENTS

| | | |
|---|---|---|
| WO | WO-2011/076405 A1 | 6/2011 |
| WO | WO-2012/175621 | 12/2012 |
| WO | WO-2014/071377 | 5/2014 |
| WO | WO-2014/128037 A1 | 8/2014 |
| WO | WO-2014/128264 A1 | 8/2014 |
| WO | WO-2014/153073 A1 | 9/2014 |

\* cited by examiner

| SAMPLE | HUMIDITY [%] | AVERAGE [g/m2/day] | MIN | MAX | STDEV |
|---|---|---|---|---|---|
| BOARD | 50 | 409 | 405 | 412 | 4 |
| BOARD | 90 | 821 | 816 | 826 | 5 |
| PAPER | 50 | 419 | 409 | 429 | 10 |
| PAPER | 90 | 1179 | 1095 | 1318 | 121 |

FIGURE 2

| MATERIAL | TOTAL PLA AMOUNT (g/m²) |
|---|---|
| PAPER + SCP | 48 |
| PAPER + SCP + AP | 80 |
| PAPER + AP + SC + AP | 74 |
| BOARD + SCP | 49 |
| BOARD + SCP + AP | 77 |
| BOARD + AP + SC + AP | 74 |

FIGURE 3

| SAMPLE | HUMIDITY (RH) | MIN | MAX | AVERAGE | STDEV |
|---|---|---|---|---|---|
| PAPER + SCP | 50 | 31 | 36 | 34 | 3 |
| PAPER + SCP | 90 | 56 | 59 | 58 | 1 |
| PAPER + SCP + 90° FOLDED | 50 | 36 | 41 | 39 | 3 |
| PAPER + SCP + 90° FOLDED | 90 | 58 | 66 | 62 | 4 |
| PAPER + SCP + AP | 50 | 16 | 25 | 21 | 6 |
| PAPER + SC + AP | 90 | 35 | 42 | 39 | 5 |
| PAPER + SCP + AP + 90° FOLDED | 50 | 16 | 32 | 26 | 9 |
| PAPER + SCP + AP + 90° FOLDED | 90 | 31 | 52 | 44 | 12 |
| PAPER + AP + SCP + AP | 50 | 20 | 29 | 24 | 5 |
| PAPER + AP + SCP + AP | 90 | 28 | 43 | 35 | 8 |
| PAPER + AP + SCP + AP + 90° | 50 | 22 | 26 | 24 | 2 |
| PAPER + AP + SCP + AP + 90° | 90 | 34 | 44 | 39 | 5 |
| BOARD + AP + SCP + AP | 50 | 24 | 27 | 26 | 2 |
| BOARD + AP + SCP + AP | 90 | 44 | 47 | 45 | 2 |
| BOARD + AP + SCP + AP + 90° | 50 | 22 | 28 | 25 | 3 |
| BOARD + AP + SCP + AP + 90° | 90 | 40 | 43 | 42 | 2 |
| BOARD + SCP + AP | 50 | 22 | 27 | 24 | 3 |
| BOARD + SCP + AP | 90 | 41 | 51 | 45 | 5 |
| BOARD + SCP + AP + 90° FOLDED | 50 | 21 | 27 | 24 | 3 |
| BOARD + SCP + AP + 90° FOLDED | 90 | 36 | 40 | 38 | 2 |
| BOARD + SCP | 50 | 34 | 43 | 37 | 5 |
| BOARD + SCP | 90 | 50 | 72 | 59 | 12 |
| BOARD + SCP + 90° FOLDED | 50 | 31 | 36 | 33 | 3 |
| BOARD + SCP + 90° FOLDED | 90 | 50 | 61 | 53 | 6 |

FIGURE 5

| SAMPLE | HUMIDITY [%] | MIN | MAX | AVERAGE [g/m2/day] | STDEV |
|---|---|---|---|---|---|
| PGA BOARD | 50 | 4,1 | 6,7 | 5,3 | 1,2 |
| PGA BOARD | 90 | 7,2 | 11,4 | 8,9 | 1,7 |
| PGA BOARD + 90° FOLDED | 50 | 8,5 | 14,0 | 11,0 | 1,9 |
| PGA BOARD + 90° FOLDED | 90 | 11,3 | 18,3 | 15,5 | 2,9 |
| PGA PAPER | 50 | 1,4 | 5,0 | 2,7 | 1,6 |
| PGA PAPER | 90 | 2,2 | 7,9 | 4,5 | 2,4 |
| PGA PAPER + 90° FOLDED | 50 | 1,4 | 3,5 | 2,1 | 0,8 |
| PGA PAPER + 90° FOLDED | 90 | 1,3 | 4,7 | 2,6 | 1,3 |

FIGURE 7

| SAMPLE | HUMIDITY [%] | MIN | MAX | AVERAGE [g/m2/day] | STDEV |
|---|---|---|---|---|---|
| PGA BOARD + HEAT TREATMENT + 90° FOLDED | 90 | 1.3 | 2.4 | 2.1 | 0.7 |
| PGA BOARD + 90° FOLDED | 90 | 11.3 | 18.3 | 15.5 | 2.9 |

FIGURE 8

| SAMPLE | ALD | HUMIDITY (%) | MIN | MAX | AVERAGE (g/m²/day) | STDEV |
|---|---|---|---|---|---|---|
| PLA BOARD + Al₂O₃ | Al₂O₃ | 50 | 4,4 | 12,6 | 7,1 | 3,1 |
| PLA BOARD + Al₂O₃ | Al₂O₃ | 90 | 11,3 | 22,3 | 14,9 | 3,8 |
| PLA BOARD + Al₂O₃ + 90° FOLDED | Al₂O₃ | 50 | 3,2 | 14,2 | 7,9 | 4,5 |
| PLA BOARD + Al₂O₃ + 90° FOLDED | Al₂O₃ | 90 | 6,4 | 25,9 | 16,0 | 9,2 |
| PLA PAPER + Al₂O₃ | Al₂O₃ | 50 | 1,7 | 8,2 | 4,4 | 2,4 |
| PLA PAPER + Al₂O₃ | Al₂O₃ | 90 | 4,1 | 13,8 | 8,1 | 4,3 |
| PLA PAPER + Al₂O₃ + 90° FOLDED | Al₂O₃ | 50 | 1,3 | 9,5 | 4,1 | 3,1 |
| PLA PAPER + Al₂O₃ + 90° FOLDED | Al₂O₃ | 90 | 3,2 | 11,2 | 6,1 | 3,1 |

FIGURE 10

| SAMPLE | HUMIDITY [%] | MIN | MAX | AVERAGE [g/m2/day] | AVERAGE STDEV |
|---|---|---|---|---|---|
| PGA BOARD + Al2O3 | 50,0 | 0,3 | 3,2 | 1,8 | 1,2 |
| PGA BOARD + Al2O3 | 90,0 | 1,6 | 6,4 | 3,6 | 1,8 |
| PGA BOARD + Al2O3 + 90° FOLDED | 50,0 | 0,4 | 6,3 | 3,8 | 2,2 |
| PGA BOARD + Al2O3 + 90° FOLDED | 90,0 | 1,6 | 12,4 | 6,5 | 4,4 |
| PGA PAPER + Al2O3 | 50,0 | 0,1 | 16,9 | 7,0 | 6,5 |
| PGA PAPER + Al2O3 | 90,0 | 3,1 | 14,9 | 7,3 | 4,9 |
| PGA PAPER + Al2O3 + 90° FOLDED | 50,0 | 2,3 | 6,6 | 4,2 | 1,9 |
| PGA PAPER + Al2O3 + 90° FOLDED | 90,0 | 0,5 | 11,1 | 4,0 | 3,8 |

FIGURE 12

| SAMPLE | HUMIDITY [%] | MIN | MAX | AVERAGE [g/m²/day] | STDEV |
|---|---|---|---|---|---|
| PLA PAPER + HYBRID | 50,0 | 8,4 | 19,5 | 15,0 | 5,9 |
| PLA PAPER + HYBRID | 90,0 | 15,4 | 33,5 | 26,0 | 9,4 |
| PLA PAPER + HYBRID + 90° FOLDED | 50,0 | 4,5 | 14,0 | 9,2 | 4,3 |
| PLA PAPER + HYBRID + 90° FOLDED | 90,0 | 7,8 | 24,9 | 16,1 | 8,0 |
| PLA BOARD + HYBRID | 50,0 | 5,8 | 14,9 | 11,1 | 4,7 |
| PLA BOARD + HYBRID | 90,0 | 11,0 | 27,3 | 20,4 | 8,4 |
| PLA BOARD + HYBRID + 90° FOLDED | 50,0 | 1,1 | 13,0 | 7,0 | 5,1 |
| PLA BOARD + HYBRID + 90° FOLDED | 90,0 | 3,6 | 22,8 | 13,3 | 8,0 |

FIGURE 14

| SAMPLE NAME | HUMIDITY (%) | MIN | MAX | AVERAGE (g/m2/day) | STDEV |
|---|---|---|---|---|---|
| PGA BOARD + HYBRID | 50 | 0.2 | 2.0 | 1.2 | 0.9 |
| PGA BOARD + HYBRID | 90 | 0.8 | 5.9 | 3.3 | 2.6 |
| PGA BOARD + HYBRID + 90° FOLDED | 50 | 0.3 | 2.5 | 1.3 | 0.9 |
| PGA BOARD + HYBRID + 90° FOLDED | 90 | 2.0 | 4.5 | 2.9 | 1.4 |
| PGA PAPER + HYBRID | 50 | 2.9 | 5.0 | 3.9 | 1.1 |
| PGA PAPER + HYBRID | 90 | 5.1 | 9.7 | 7.6 | 2.3 |
| PGA PAPER + HYBRID + 90° FOLDED | 50 | 2.3 | 2.6 | 2.5 | 0.2 |
| PGA PAPER + HYBRID + 90° FOLDED | 90 | 1.0 | 6.9 | 4.2 | 3.0 |

FIGURE 16

MOISTURE BARRIERS FOR PAPER MATERIALS

CROSS-REFERENCE TO RELATED APPLICATIONS

This application is a divisional of U.S. patent application Ser. No. 14/543,568 filed Nov. 17, 2014, the content of which is hereby incorporated by reference in its entirety.

FIELD OF THE DISCLOSURE

The present disclosure relates to a tobacco packaging material. In particular, the present disclosure relates to a tobacco packaging material comprising a paper material coated with at least one repulpable polymer layer and optionally at least one layer deposited by atomic layer deposition (ALD).

DISCLOSURE OF RELATED ART

Tobacco product packages and materials used to construct packaged cigarettes are known in the art. Typically, overwrap materials are used in tobacco product packages. Suitable overwrap materials include polypropylene films, such as films characterized as "cellophane-type films" that traditionally have been employed for wrapping packaged cigarettes. See, for example, the types of overwrap materials described in U.S. Pat. No. 5,139,140 to Burrows et al. and U.S. Pat. No. 5,542,529 to Hein, III et al., each of which is incorporated herein by reference.

The outer wrapping material assembly can be equipped with tear tape. See, for example, U.S. Pat. No. 4,717,017 to Sprinkel, Jr. et al.; U.S. Pat. No. 4,836,378 to Lephardt; U.S. Pat. No. 5,192,262 to Amendola et al.; U.S. Pat. No. 5,595,803 to May et al.; and U.S. Pat. No. 7,118,792 to Hewitt et al.; each of which is incorporated herein by reference. Representative types of tear tape materials suitable for use in association with other cigarette packaging materials are available from commercial sources such as Arlin Mfg. Co., Inc. and P. P. Payne Limited.

Additional cigarette packages and packaged cigarettes are described in, for example, U.S. Pat. No. 4,852,734 to Allen; U.S. Pat. No. 5,139,140 to Burrows; U.S. Pat. No. 5,333,729 to Wolfe; U.S. Pat. No. 5,542,529 to Hein; U.S. Pat. No. 8,522,515 to Carter; U.S. Pat. No. 8,118,161 to Guerrera et al.; U.S. Pat. No. 8,783,454 to Igo; WO/2011/076405 to Igo; WO/2014/128037 to Pilzecker; WO/2014/128264 to Pilzecker; and EP 2769930A to Pilzecker; each of which is incorporated herein by reference.

However, because prior art tobacco product packages usually include either a foil inner liner or a polypropylene film to protect tobaccos from moisture loss, they cannot be directly recycled and thus are not environmentally friendly. It would be desirable to provide a tobacco package that is fully recyclable, which should be substantially free of any foil inner liner or polypropylene film while still capable of protecting tobaccos from moisture loss.

SUMMARY

The above and other needs are met by aspects of the present disclosure which, in a first aspect, provides a tobacco packaging material, comprising a paper material coated with at least one polymer layer, wherein the polymer layer comprise at least one repulpable polymer, and wherein the tobacco packaging material has a water vapor transmission rate (WVTR) that is at least 90% lower than the paper material.

In some embodiments, the tobacco packaging material further comprises at least one ALD layer, wherein the ALD layer comprises a metal oxide. In some embodiments, the tobacco packaging material has a WVTR of 10 $g/m^2/day$ or less at 38° C. and 90% RH.

In second aspect, a tobacco package is provided, wherein the tobacco package comprises the tobacco packaging material described herein and is substantially free of any foil inner liner (e.g., Aluminum foil) or polypropylene film (e.g., OPP film).

In a third aspect, a method for making a tobacco packaging material is provided, comprising extrusion coating at least one repulpable polymer onto a paper material to form a polymer layer, wherein the tobacco packaging material has a WVTR that is at least 90% lower than the paper material.

In some embodiments, the method further comprises heat treating the paper material coated with the polymer layer. In some embodiment, the method further comprises depositing at least one ALD layer onto the paper material coated with the polymer layer, wherein the ALD layer comprises a metal oxide.

Further features and advantages of the present disclosure are set forth in more detail in the following description.

BRIEF DESCRIPTION OF THE DRAWINGS

Figure 1:
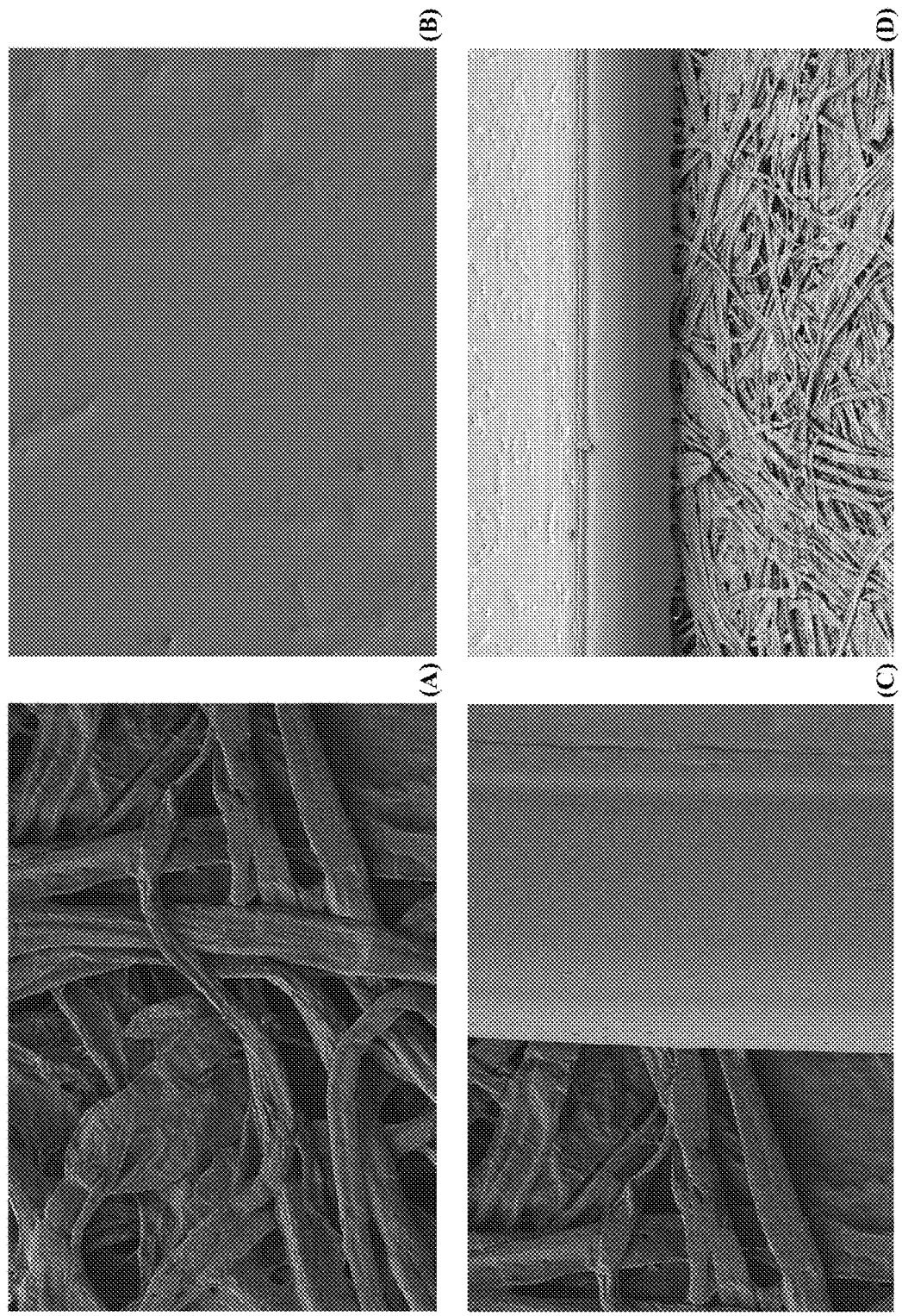

Having thus described the disclosure in general terms, reference will now be made to the accompanying drawings, which are not necessarily drawn to scale, and wherein:

FIG. 1 shows: (A) a top view image of uncoated paperboard (Mag=500×); (B) a top view image of polylactic acid (PLA) coated paperboard (Mag=500×); (C) a top view image of the PLA-paperboard interface (Mag=500×); and (D) a cross-sectional image of the PLA coating on paperboard (Mag=100×).

FIG. 2 shows WVTR (at 50% or 90% RH, 23° C.) results of plain paper and board substrates.

FIG. 3 shows PLA amounts of each extrusion coating recipe.

Figure 4:
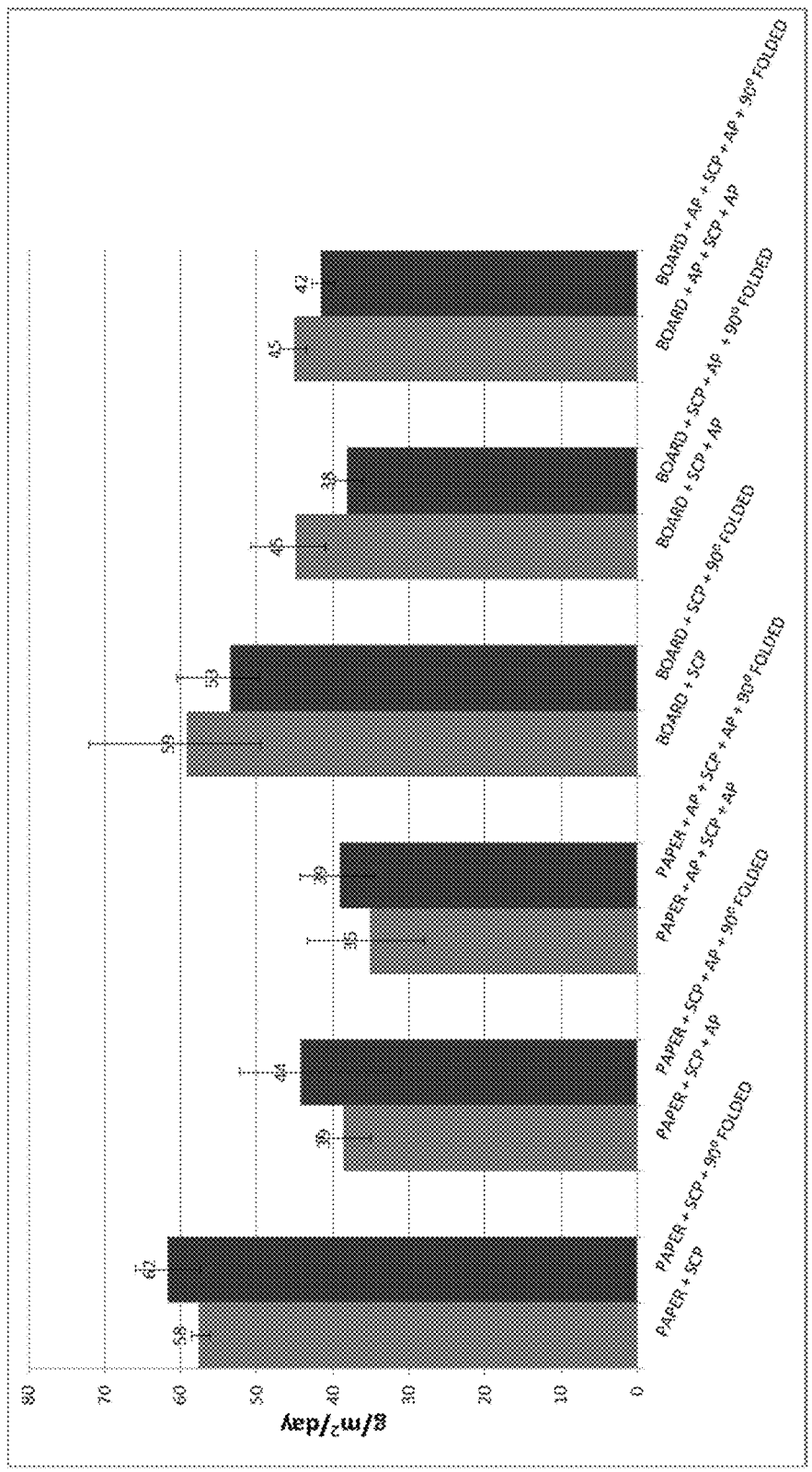

FIG. 4 shows a WVTR (at 90% RH, 23° C.) comparison of 90° folded and non-folded PLA coated paper and board.

FIG. 5 shows WVTR (at 50% or 90% RH, 23° C.) results of PLA extrusion coated paper and board substrates.

Figure 6:
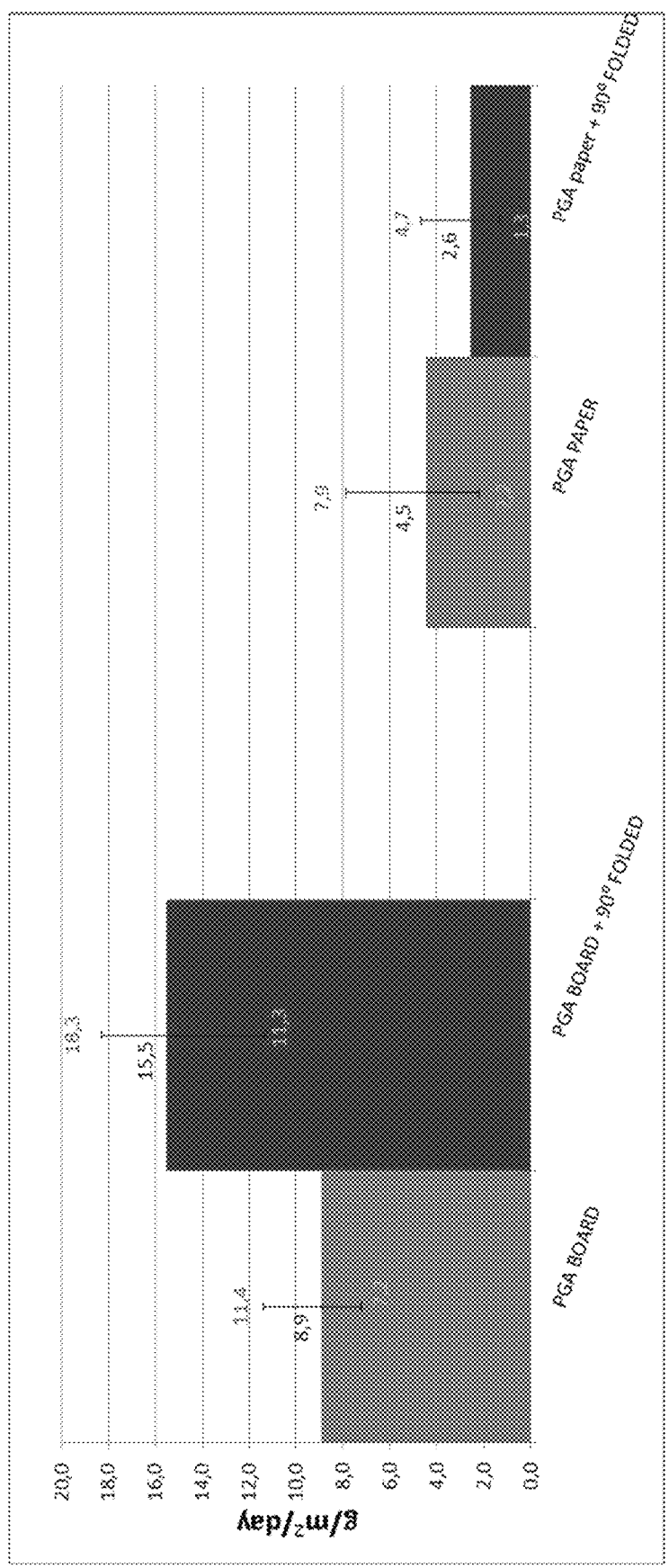

FIG. 6 shows a WVTR (at 90% RH, 23° C.) comparison of 90° folded and non-folded PGA coated paper and board.

FIG. 7 shows WVTR (at 50% or 90% RH, 23° C.) results of PGA extrusion coated paper and board.

FIG. 8 shows WVTR (at 90% RH, 23° C.) results of heat treated non-folded and folded PGA extrusion coated board.

Figure 9:
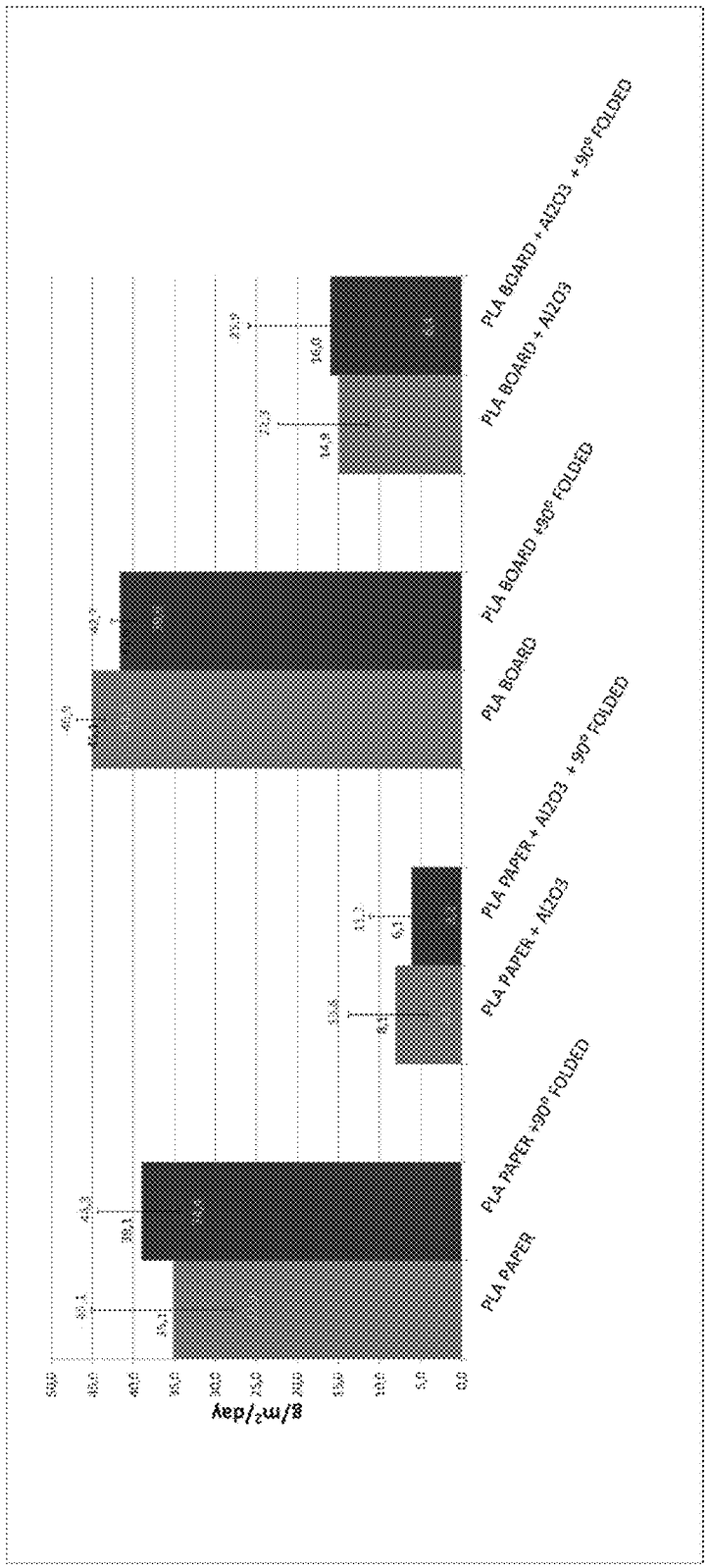

FIG. 9 shows WVTR (at 90% RH, 23° C.) results of 90° folded and non-folded ALD $Al_2O_3$ coated PLA paper and board.

FIG. 10 shows WVTR (at 50% or 90% RH, 23° C.) results of ALD A1203 coated PLA paper and board.

Figure 11:
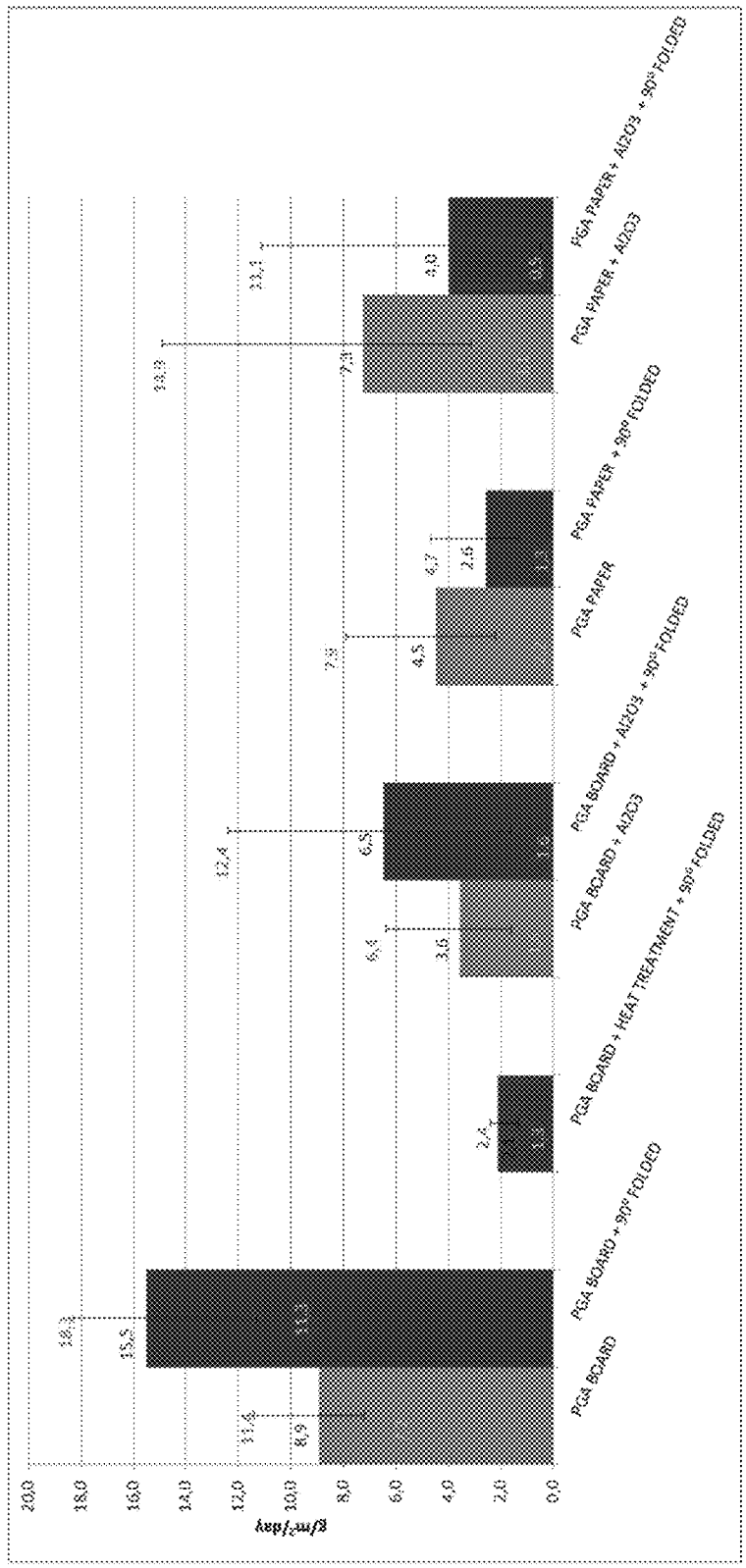

FIG. 11 shows WVTR (at 90% RH, 23° C.) results of 90° folded and non-folded ALD $Al_2O_3$ coated PGA paper and board.

FIG. 12 shows WVTR (at 50% or 90% RH, 23° C.) results of ALD $Al_2O_3$ coated PGA paper and board.

Figure 13:
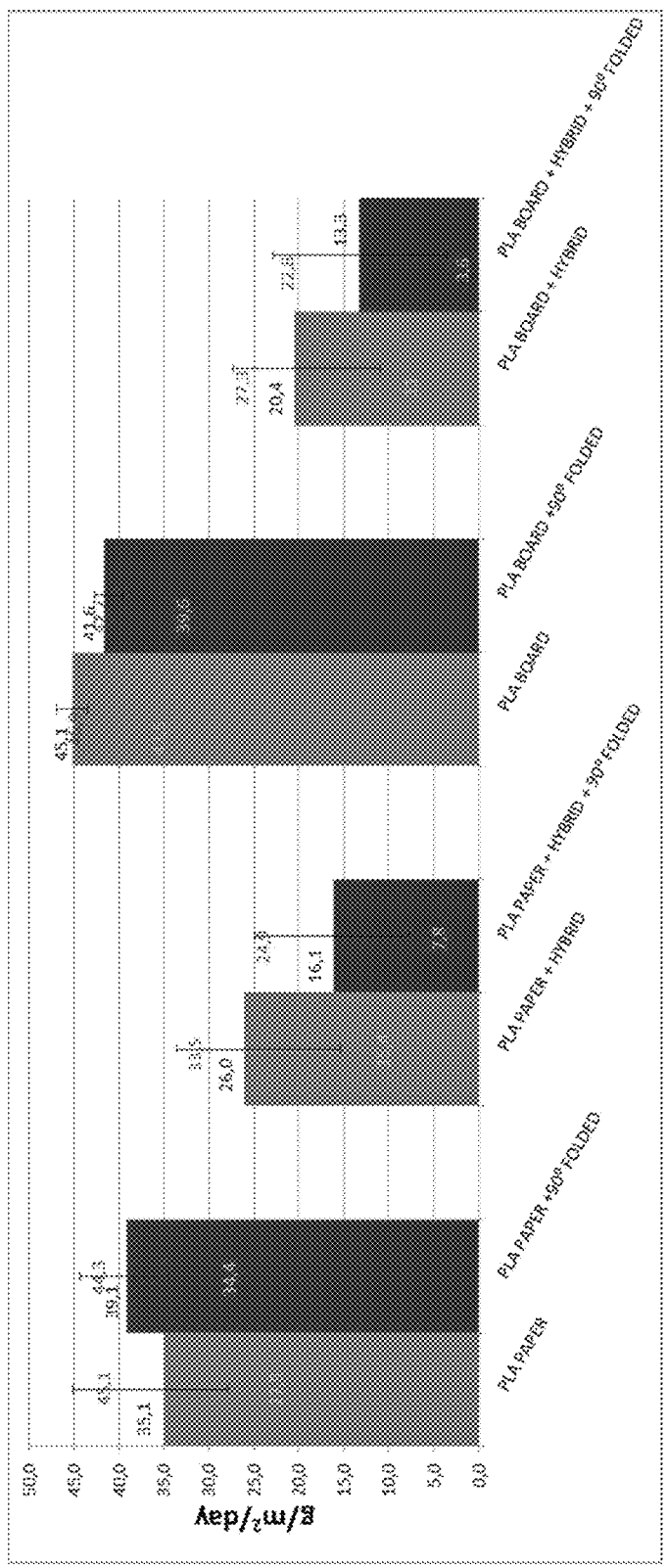

FIG. 13 shows WVTR (at 90% RH, 23° C.) results of 90° folded and non-folded ALD hybrid coated PLA paper and board.

FIG. 14 shows WVTR (at 50% or 90% RH, 23° C.) results of ALD hybrid coated PLA paper and board.

Figure 15:
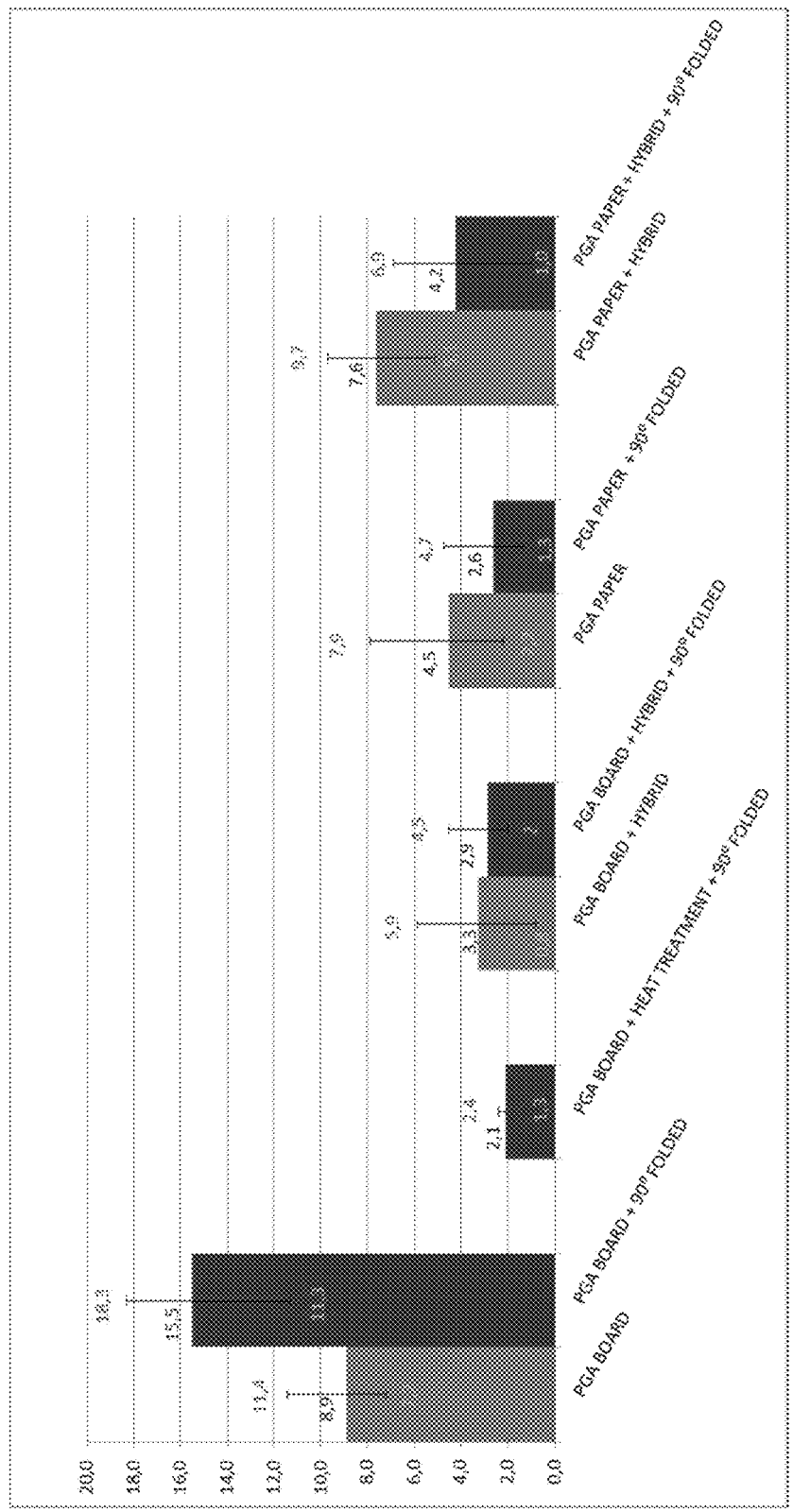

FIG. 15 shows WVTR (at 90% RH, 23° C.) results of 90° folded and non-folded ALD hybrid coated PGA paper and board.

FIG. 16 shows WVTR (at 50% or 90% RH, 23° C.) results of ALD hybrid coated PGA paper and board.

DETAILED DESCRIPTION OF THE DISCLOSURE

The present disclosure now will be described more fully hereinafter with reference to the accompanying drawings, in which some, but not all aspects of the disclosure are shown. Indeed, the disclosure may be embodied in many different forms and should not be construed as limited to the aspects set forth herein; rather, these aspects are provided so that this disclosure will be thorough and complete, will fully convey the scope of the disclosure to those skilled in the art, and will satisfy applicable legal requirements. Like numbers refer to like elements throughout. As used in this specification and the claims, the singular forms "a," "an," and "the" include plural referents unless the context clearly dictates otherwise.

Tobacco Packaging Material

In various embodiments, the invention described herein relates to a tobacco packaging material comprising a paper material coated with at least one polymer layer, wherein the polymer layer comprise at least one repulpable polymer.

The paper material can be, for example, any commercial paper and board substrate that are suitable for making tobacco packages. In one embodiment, the paper material is a paper having a base weight of 20-200 $g/m^2$. In another embodiment, the paper material is a paper having a base weight of 50-150 $g/m^2$. In a further embodiment, the paper material is a board having a base weight of 100-500 $g/m^2$. In another embodiment, the paper material is a board having a base weight of 200-300 $g/m^2$.

The paper material can comprise, for example, one or more additives. In one embodiment, the additive is nanocellulose based materials. In one embodiment, the additive is cellulose nanofibrils (CNF). In one embodiment, the additive is cellulose nanocrystals (CNC).

Repulpable polymers refer to polymers that can be repulped and, therefore, directly recyclable without having to be separated from the paper materials of tobacco packages. As a result, the repulpable polymer-coated paper material described herein is more environmentally friendly than polymer materials currently used in tobacco packages, such as polypropylene. The repulpable polymers can be, for example, biodegradable. In one embodiment, the repulpable polymer is polyglycolic acid (PGA). In another embodiment, the repulpable polymer is polylactic acid (PLA). In a further embodiment, the repulpable polymer is polyhydroxyalkanoate (PHA).

In one embodiment, the paper material is coated with a single polymer layer, such as an amorphous polymer layer or a semi-crystalline polymer layer. In another embodiment, the polymer is coated with multiple polymer layers, such as at least two polymer layers or at least three polymer layers. The multiple polymer layers can comprise, for example, the same polymer. The multiple polymer layers can comprise, for example, different polymers. The multiple polymer layers can comprise, for example, two layers each comprising the same polymer but with different crystallinity.

In one embodiment, the paper material is coated with at least one amorphous polymer layer and at least one semi-crystalline polymer layer. In another embodiment, the paper material is coated with at least two amorphous polymer layers and at least one semi-crystalline polymer layer. In a further embodiment, the paper material is coated with at least one amorphous polymer layer and at least two semi-crystalline polymer layers. In one embodiment, the paper material is coated with an amorphous polymer layer as the bottom layer directly in contact with the paper material. In another embodiment, the paper material is coated with a semi-crystalline polymer layer as the bottom layer directly in contact with the paper material. In one embodiment, the paper material is coated with more than one layer, with the top layer being an amorphous polymer layer. In another embodiment, the paper material is coated with more than one layer, with the top layer being a semi-crystalline polymer layer.

In one embodiment, the paper material is coated with about 1-100 $g/m^2$ of polymers. In another embodiment, the paper material is coated with about 10-300 $g/m^2$ of polymers. In another embodiment, the paper material is coated with about 20-200 $g/m^2$ of polymers. In a further embodiment, the paper material is coated with about 30-100 $g/m^2$ of polymers.

In some embodiments, the paper material coated with the polymer layer is heat treated to increase crystallinity.

The tobacco packaging material can further comprise, for example, at least one inorganic ALD layer. The ALD layer can comprise, for example, a metal oxide. More specifically, the ALD layer can comprise, for example, $Al_2O_3$ or $SiO_2$. In addition to the inorganic material, the ALD layer can further comprise, for example, an organic material. In one embodiment, the ALD layer has a thickness of 1-500 nm. In another embodiment, the ALD layer has a thickness of 2-200 nm. In a further embodiment, the ALD layer has a thickness of 5-100 nm.

In some embodiments, the tobacco packaging material comprises at least two ALD layers. In some embodiments, the tobacco packaging material comprises a partially organic bottom layer and an inorganic top layer. The inorganic top layer can comprises, for example, $Al_2O_3$ or $SiO_2$, for improving the barrier properties of the tobacco packaging material. The partially organic bottom layer can comprises, for example, a metal oxide and an elastic organic material, to provide elasticity to the whole ALD layer structure and improve cracking behavior of the top inorganic layer.

In one embodiment, the WVTR of the tobacco packaging material is at least 70% lower than the WVTR of the paper material without any polymer layer or ALD layer. In another embodiment, the WVTR of the tobacco packaging material is at least 90% lower than the WVTR of the paper material without any polymer layer or ALD layer. In a further embodiment, the WVTR of the tobacco packaging material is at least 95% lower than the WVTR of the paper material without any polymer layer or ALD layer. In yet another embodiment, the WVTR of the tobacco packaging material is at least 98% lower than the WVTR of the paper material without any polymer layer or ALD layer. In yet a further embodiment, the WVTR of the tobacco packaging material is at least 99% lower than the WVTR of the paper material without any polymer layer or ALD layer.

In one embodiment, the tobacco packaging material has a WVTR of 20 $g/m^2$/day or less at 38° C. and 90% RH. In another embodiment, the tobacco packaging material has a WVTR of 10 $g/m^2$/day or less at 38° C. and 90% RH. In still another embodiment, the tobacco packaging material has a WVTR of 5 $g/m^2$/day or less at 38° C. and 90% RH. In a further embodiment, the tobacco packaging material has a WVTR of 3.4 $g/m^2$/day or less at 38° C. and 90% RH. In a further embodiment, the tobacco packaging material has a WVTR of 2 $g/m^2$/day or less at 38° C. and 90% RH.

In one embodiment, the tobacco packaging material has a WVTR of 10 g/m$^2$/day or less at 38° C. and 50% RH. In another embodiment, the tobacco packaging material has a WVTR of 5 g/m$^2$/day or less at 38° C. and 50% RH. In a further embodiment, the tobacco packaging material has a WVTR of 4 g/m$^2$/day or less at 38° C. and 50% RH. In yet another embodiment, the tobacco packaging material has a WVTR of 3 g/m$^2$/day or less at 38° C. and 50% RH. In yet a further embodiment, the tobacco packaging material has a WVTR of 2 g/m$^2$/day or less at 38° C. and 50% RH.

In one embodiment, the tobacco packaging material has a WVTR of 20 g/m$^2$/day or less at 23° C. and 90% RH. In another embodiment, the tobacco packaging material has a WVTR of 10 g/m$^2$/day or less at 23° C. and 90% RH. In a further embodiment, the tobacco packaging material has a WVTR of 5 g/m$^2$/day or less at 23° C. and 90% RH. In yet another embodiment, the tobacco packaging material has a WVTR of 4 g/m$^2$/day or less at 23° C. and 90% RH. In yet a further embodiment, the tobacco packaging material has a WVTR of 3 g/m$^2$/day or less at 23° C. and 90% RH.

In one embodiment, the tobacco packaging material has a WVTR of 10 g/m$^2$/day or less at 23° C. and 50% RH. In another embodiment, the tobacco packaging material has a WVTR of 5 g/m$^2$/day or less at 23° C. and 50% RH. In a further embodiment, the tobacco packaging material has a WVTR of 4 g/m$^2$/day or less at 23° C. and 50% RH. In yet another embodiment, the tobacco packaging material has a WVTR of 3 g/m$^2$/day or less at 23° C. and 50% RH. In yet a further embodiment, the tobacco packaging material has a WVTR of 2 g/m$^2$/day or less at 23° C. and 50% RH.

In one embodiment, the WVTR of the tobacco packaging material is substantially unaffected by 90° folding.

In some embodiments, the invention described herein relates to a tobacco package comprising the tobacco packaging material. Because the tobacco packaging material described herein has excellent barrier properties (e.g., WVTR), the tobacco package made therefrom need not include a foil inner liner (e.g., Aluminum foil) or a polypropylene film (e.g., OPP film). Hence, in one embodiment, the tobacco package is substantially free of any foil inner liner or polypropylene film. In another embodiment, the tobacco package is totally free of any foil inner liner or polypropylene film.

Method for Making Tobacco Packaging Material

The present invention described herein also relates to a method for making a tobacco packaging material, comprising extrusion coating at least one repulpable polymer onto a paper material to form a polymer layer, wherein the tobacco packaging material has a WVTR that is at least 90% lower than the paper material.

The method can comprise, for example, extrusion coating a single polymer layer onto the paper material, such as an amorphous polymer layer or a semi-crystalline polymer layer. The method can comprise, for example, extrusion coating multiple polymer layers onto the paper material, such as at least two polymer layers or at least three polymer layers. The multiple polymer layers can comprise, for example, the same polymer. The multiple polymer layers can comprise, for example, different polymers. The multiple polymer layers can comprise, for example, two layers each comprising the same polymer but with different crystallinity.

The method can comprise, for example, extrusion coating at least one amorphous polymer layer and at least one semi-crystalline polymer layer onto the paper material. The method can comprise, for example, extrusion coating at least two amorphous polymer layers and at least one semi-crystalline polymer layer onto the paper material. The method can comprise, for example, extrusion coating at least one amorphous polymer layer and at least two semi-crystalline polymer layers onto the paper material. The method can comprise, for example, extrusion coating an amorphous polymer layer as the bottom layer directly in contact with the paper material. The method can comprise, for example, extrusion coating a semi-crystalline polymer layer as the bottom layer directly in contact with the paper material. The method can comprise, for example, extrusion coating an amorphous polymer as the top layer above another polymer layer. The method can comprise, for example, extrusion coating a semi-crystalline polymer as the top layer above another polymer layer.

The extrusion coated polymer layer can be, for example, heat treated to increase crystallinity. In one embodiment, the extrusion coated polymer layer is heat treated at 50-200° C. for 0.1-5 hours. In another embodiment, the extrusion coated polymer layer is heat treated at 80-150° C. for 0.5-2 hours.

The method can comprise, for example, depositing at least one ALD layer onto the paper material coated with the polymer layer. The method can comprises, for example, depositing at least two ALD layer onto the paper material coated with the polymer layer. The ALD layer can comprises, for example, an inorganic material. The inorganic material can be, for example, metal oxide. The ALD layer can comprise, for example, $Al_2O_3$. In one embodiment, the $Al_2O_3$ layer is prepared using trimethylaluminum (TMA) and ozone oxidation. In another embodiment, the $Al_2O_3$ layer is prepared using TMA and water as an oxygen source. The ALD layer can comprise, for example, $SiO_2$. In addition to the inorganic material, the ALD layer can further comprise, for example, an organic material. In one embodiment, the hybrid inorganic/organic ALD layer is prepared using TMA and ethylene glycol (EG).

In one embodiment, the ALD layer has a thickness of 1-500 nm. In another embodiment, the ALD layer has a thickness of 2-200 nm. In a further embodiment, the ALD layer has a thickness of 5-100 nm.

WORKING EXAMPLES

In the working examples, the suitability of polymer-coated paper and board as replacements for current tobacco packaging material, e.g. polypropylene (PP) and Aluminum (Al) foil, was evaluated. Specifically, barrier coatings were coated onto two different substrates, one paper and one board substrates. Substrates were supplied in reel-form of width 30 cm. Substrates were firstly coated in the extrusion roll to roll coating line with two different polymers polyglycolic acid (PGA) and polylactic acid (PLA). The extrusion coatings significantly improved water vapor transmission rate (WVTR) barrier properties of the coated base substrate. In addition, atomic layer deposition (ALD) thin film coating was applied onto extrusion coated polymers to further enhance barrier properties. Two different types of ALD coatings were tested, inorganic alumina ($Al_2O_3$) coating and hybrid organic/inorganic coating. The barrier level target was 1 g/m2/day in 90% relative humidity (RH) and in temperature of 23° C., which could be achieved by combining two coating methods. The WVTR barrier target level was also achieved after the samples have been subjected to the 90° folding process, which would test the packaging process sustainability of the barrier properties. WVTR barrier values were measured before and after folding process to assess the effect of folding treatment on the barrier properties of the coated material. Dry cup method (ISO 2528:19958E) was used in the barrier measurements. At least three parallel WVTR measurements were conducted, in the measurement of each test point. Crease and folding treatments were applied to the machine direction (MID) of the sample substrates.

Example 1—WVTR Results of Plain Paper and Board Substrates

Paper and board substrates with basis weights of 80 and 237 g/m2, respectively, were delivered by Reynolds Tobacco Company. WVTR was measured at 50%/23° C. and 90%/23° C. from both materials before any coating treatment in order to obtain a reference points which can be used as a benchmark in the assessment of the coating treatment effect in WVTR performance. WVTR results for plain paper and board substrate are shown in FIG. 2. As seen in the results, the permeability values were very high without any coating treatment.

Example 2—WVTR Results of PLA Extrusion Coated Substrates

Two different PLA grades were used in the extrusion coating recipes: semi-crystalline PLA (NatureWorks, 4032D) and amorphous PLA (NatureWorks 4060D). Three different extrusion coating recipes were used. The first coating recipe includes only one semi-crystalline PLA (SCP) coating layer, extrusion coated onto base substrates. The second recipe includes a two-layer structure, comprising a SCP layer and an amorphous PLA (AP) layer as the bottom layer and the top layer, respectively. The third recipe includes a three-layer structure, comprising AP, SC and AP, in bottom to top order. The amorphous PLA layer is considered to give better adhesion to the base material and better heat sealing properties, while the semi-crystalline PLA is considered to be a better grade in terms of barrier properties. Each coating structure was used for coating both substrates. The coating amount of each recipe is shown in FIG. 3.

It is evident, from the FIGS. 3 and 4, that the thicker coating resulted in lower WVTR permeability values.

A significant improvement in barrier properties was achieved for all PLA coated materials. Barrier values for two-layer and three-layer structures for both substrates are around 40 g/m2/day with some variation after 90° folding. This was a significant improvement compared to the initial WVTR of uncoated materials, which were around 1200 and 820 g/m2/day for paper and board, respectively. More significantly, the barrier properties did not seem to deteriorate after the folding process, compared to non-folded samples.

All coated materials formed strong heat sealed bonds at a temperature of 130°, though differences in heat sealing properties are likely at lower temperatures and shorter heat sealing times. Coating amorphous PLA as the uppermost layer likely resulted in better heat sealing properties at lower temperatures and shorter heat sealing times. The measured barrier values for non-folded and folded samples at 50% and 90% RH are shown in FIG. 5.

In the multilayer coatings of which the bottom surface is amorphous (A+SC+A), the adhesion of the coating was slightly better and not so easily delaminated away from the base material. PLA adhesion in the base material could be improved by optimizing the parameters of extrusion coating process (e.g. extrusion temperature).

Example 3—WVTR Results of PGA Extrusion Coated Substrates

PGA coating amounts were 48 and 49 g/m2 for paper and board, respectively. Kuredux PGA grade by Kureha Corporation was used in the coating trials. A significant improvement in barrier properties of PGA coated board and paper was achieved. WVTR results at 90% RH were around 15 g/m2/day with some variation for a 90° folded PGA board. For PGA coated paper, WVTR values of less than 2 g/m2/day were recorded, as shown in FIG. 6. In addition, measured barrier values at 50% and 90% RH for non-folded and folded samples are shown in FIG. 7.

The PGA adhesion was weak onto both paper and board substrates. As was the case of PLA adhesion, PGA adhesion onto the base material, could be improved by optimizing the parameters of extrusion coating process (e.g. extrusion temperature).

Improved WVTR Results of Oven Heat Treated PGA Extrusion Coated Board

Because PGA coated board did not reach the same low permeability values as the corresponding PGA coated paper samples, it was attempted to further improve the permeability properties by one hour oven heat treatment at a temperature of 100° C. Heat treatment improved the WVTR permeability properties of the PGA coated board as can been seen in the FIG. 8 for 90° folded samples. Values as low as PGA coated paper were achieved for PGA coated board as well, around 2 g/m2/day at 90% RH. Such improvement could be explained by further crystallization of the PGA coating, due to heat exposure, and as a result better WVTR permeability properties. This may be explained by the fact that extrusion coated PGA did not get crystallized so effectively in the coating process of board because the board's higher basis weight, compared to paper. Board's greater mass could take away the heat needed in the crystallization change of a PGA coating.

Example 4—WVTR Results of $Al_2O_3$ ALD Coating onto Extrusion Coated Substrates $Al_2O_3$ ALD Coating Onto PLA Coated Substrates ALD $Al_2O_3$ coating was prepared in one hundred degrees centigrade using trimethylaluminum (TMA) and ozone oxidation. The thickness of the $Al_2O_3$ coating, measured on the surface of a silicon wafer, was 25 nm. Determination of the true thickness of ALD coating on the PLA and PGA coated paper and board was not possible, as a feasible technology to do such a measurement does not exist. Average as well as minimum and maximum measured WVTR (90%/23°) results for non-folded and folded $Al_2O_3$ coated PLA substrates are shown in FIG. 9. For comparison, results of the PLA coated paper and board without $Al_2O_3$ coatings are also included in FIG. 9.

$Al_2O_3$ coating significantly improved the WVTR results compared to the samples without the coating. Parallel measurements show quite high variation, and interestingly the lowest individual measurement (3.2 g/m2/day) were made for 90° folded PLA paper sample. Based on the results, it is evident that the $Al_2O_3$ barrier layer performance could withstand stresses caused by the folding process. In the optimized process (both extrusion and ALD), permeability values of less than 5 g/m2/day with smaller variation, could be achieved.

The measured barrier values in 50% and 90% RH for non-folded and folded samples are shown in FIG. 10.

$Al_2O_3$ ALD Coating Onto PGA Coated Substrates

ALD $Al_2O_3$ coating was prepared using trimethylaluminium (TMA) and ozone oxidation, the same recipe that was used for the coating of PLA materials. Average as well as minimum and maximum measured WVTR (90%/23° C.) results for non-folded and folded samples are presented in FIG. 11. Results of PGA coated paper and board without $Al_2O_3$ coatings and also PGA board with heat treatment and without $Al_2O_3$ coating have been included in FIG. 11 to facilitate comparison.

As can be seen in FIG. 11, ALD $Al_2O_3$ coating onto PGA did not significantly improve barrier performance of the samples, especially if compared to the barrier level achieved by an oven heat-treatment of PGA coated board. Also, a relative large variation existed between parallel measurements. However, the lowest individual permeability value (0.5 g/m2/day) was measured for the 90° folded and $Al_2O_3$ coated PGA paper. Under these test conditions, $Al_2O_3$ barrier layer performance could withstand folding process stresses well. In an optimized process comprising both extrusion and ALD, permeability values below 1 with lower variation can be achieved.

The measured barrier values in 50% and 90% RH for non-folded and folded samples are presented in FIG. 12.

Example 5—The WVTR Results of Hybrid ALD Coating Onto Extrusion Coated Substrates A hybrid ALD surface comprising two layers was coated on extrusion coated substrate. The bottom layer was prepared using TMA and ethylene glycol (EG). A partially organic bottom layer gave elasticity to the whole ALD layer structure and improve cracking behavior of the top inorganic $Al_2O_3$ layer which could easily crack. The theoretical thickness of the bottom layer is 50 nm. The top layer was pure $Al_2O_3$, prepared using TMA and water as an oxygen source. The top $Al_2O_3$ layer provided barrier performance properties of the hybrid structure.

Hybrid ALD Coating Onto PLA Coated Substrates

Average as well as minimum and maximum measured WVTR (90%/23° C.) results for non-folded and folded samples are presented in FIG. 13. Results of the PLA coated paper and board without hybrid ALD coatings are also include in FIG. 13 to facilitate comparison.

Hybrid ALD coating improved the WVTR results compared to samples without such coating. However, hybrid layer structure showed weaker barrier performance improvements compared to the single layer $Al_2O_3$ ALD coating. A relative large variation existed between parallel measurements. As was the case of the single layer $Al_2O_3$ coating, hybrid structure barrier layer performance could withstand folding process stresses.

The measured barrier values in 50% and 90% RH for non-folded and folded samples are presented in FIG. 14.

Hybrid ALD Coating Onto PGA Coated Substrates

Average as well as minimum and maximum measured WVTR (90%/23° C.) results for non-folded and folded samples are presented in FIG. 15. Results of PGA coated paper and board without $Al_2O_3$ coatings and also PGA board with heat treatment and without $Al_2O_3$ coating are also included in FIG. 15 to facilitate comparison.

As shown in FIG. 15, coating a hybrid ALD layer onto PGA did not improve barrier performance of the samples, especially if compared to the barrier level achieved by an oven heat-treatment of the PGA-coated board. However, the hybrid ALD coating had somewhat less variation between the parallel measurements compared to the single layer $Al_2O_3$ coating.

The measured barrier values in 50% and 90% RH for not-folded and folded samples are presented in FIG. 16.

Example 6—Summary

A paper and board substrate has been provided with basis weights of 80 and 237 g/m2, respectively. WVTR was measured in conditions of 50%/23° C. and 90%/23° C. for both materials before any coating treatment in order to obtain the reference points which can be used as a benchmark in the assessment of the coating treatment effect in the WVTR performance of the substrates. Barrier values 1200 and 820 g/m2/day were measured in RH of 90% for paper and board, respectively.

Three different extrusion coating recipes were used for PLA coatings. First coating recipe included only one semi-crystalline PLA (SCP) coating layer, extrusion coated onto base substrates. The second recipe contained two-layer structure, SCP and amorphous PLA (AP) layer, the bottom and the top layer, respectively. Third recipe includes three-layer structure AP, SC and AP, in bottom to top order. Significant improvements in barrier properties for all PLA coated materials were achieved. Barrier values in 90% RH for two- and three-layer PLA structures after exposed 90° folding process were in the order of 40 g/m2/day. The barrier properties did not seem to deteriorate after the folding process, compared to non-folded samples.

The above is particularly suitable for improving the packaging process of tobacco products. All PLA coated materials can form strong heat sealed bonds in temperature of 130° C., but differences in heat sealing properties are likely to appear in lower temperatures and shorter sealing times. There is room for improving adhesion of the extrusion coated PLA onto base materials such as paper and board.

PGA coating amounts were 48 and 49 g/m2 for the paper and the board, respectively. A significant improvement in barrier properties for PGA coated board and paper was achieved. For the PGA coated board and the 90° folded samples, WVTR results in 90% RH were around 15 g/m2/day with some variation. For PGA coated paper, permeability values of less than 2 g/m2/day were measured. Because the PGA coated board did not reach the same low permeability values than the corresponding PGA coated paper samples, it was attempted to improve the permeability properties further by one hour oven heat treatment at a temperature of 100° C. Heat treatment improved the WVTR permeability properties of the PGA coated board to the same level as in PGA coated paper samples. PGA adhesion in the base material could be improved by optimizing the parameters of extrusion coating process (e.g. extrusion temperature). PGA coated materials formed strong heat sealed bonds at a temperature of 130° C.

ALD $Al_2O_3$ coating was prepared in 100° C. using trimethylaluminium (TMA) and ozone oxidation. The thickness of the $Al_2O_3$ coating, measured on the surface of a silicon wafer, was 25 nm. ALD $Al_2O_3$ thin film on PLA coated substrates significantly improved the WVTR results compared to the samples without ALD treatment. $Al_2O_3$ barrier layer performance could withstand stresses caused by the folding process. In the optimized process for PLA substrates comprising both extrusion and ALD, barrier values of less than 5 g/m2/day in 90% RH with small variation could be achieved for ALD $Al_2O_3$ coated PLA substrates. ALD $Al_2O_3$ coating onto PGA coated substrates did not significantly improve barrier performance of the samples compared to the PGA coated substrates without ALD coating. However, in the optimized process for PGA substrates comprising both extrusion and ALD, barrier values of less than 1 g/m2/day with lower variation could be achieved. In addition, it appeared that the hybrid ALD coating structure did not bring any barrier performance improvements compared to single layer ALD $Al_2O_3$ coating (single layer ALD inorganic films such as $Al_2O_3$ is actually easier for industrial roll-to-roll production).

Many modifications and other aspects of the disclosures set forth herein will come to mind to one skilled in the art to which these disclosures pertain having the benefit of the teachings presented in the foregoing descriptions and the associated drawings. Therefore, it is to be understood that the disclosures are not to be limited to the specific aspects disclosed and that equivalents, modifications, and other aspects are intended to be included within the scope of the appended claims. Although specific terms are employed herein, they are used in a generic and descriptive sense only and not for purposes of limitation.

That which is claimed:

1. A method for making a tobacco packaging material, the method comprising:
    extrusion coating at least one repulpable polymer onto a paper material to form a polymer layer;
    depositing at least two atomic layer deposition (ALD) layers onto the paper material coated with the polymer layer, wherein the at least two ALD layers comprises at least one metal oxide layer and at least one elastic metal oxide/organic layer; and
    heat treating the paper material coated with the polymer layer prior to depositing the at least two ALD layers, wherein the tobacco packaging material has a water vapor transmission rate (WVTR) that is at least 90% lower than the paper material.

2. The method of claim 1, wherein the polymer layer comprises a polymer selected from the group consisting of polyglycolic acid (PGA) and polylactic acid (PLA).

3. The method of claim 1, wherein the paper material is coated with at least two polymer layers having different crystallinity.

4. The method of claim 1, wherein the paper material is coated with about 1-200 $g/m^2$ of the polymer.

5. The method of claim 1, wherein the at least two ALD layers comprise a metal oxide selected from the group consisting of $Al_2O_3$ and $SiO_2$.

6. The method of claim 1, wherein the tobacco packaging material has a WVTR of 10 $g/m^2$/day or less at 38° C. and 90% RH.

7. The method of claim 1, wherein the tobacco packaging material has a WVTR of 3.4 $g/m^2$/day or less at 38° C. and 90% RH.

* * * * *